United States Patent
Sun et al.

(10) Patent No.: US 8,916,434 B2
(45) Date of Patent: Dec. 23, 2014

(54) ENHANCED HYDROGEN BARRIER ENCAPSULATION METHOD FOR THE CONTROL OF HYDROGEN INDUCED DEGRADATION OF FERROELECTRIC CAPACITORS IN AN F-RAM PROCESS

(75) Inventors: Shan Sun, Colorado Springs, CO (US); Thomas E. Davenport, Denver, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 12 days.

(21) Appl. No.: 13/470,117

(22) Filed: May 11, 2012

(65) Prior Publication Data

US 2013/0300003 A1    Nov. 14, 2013

(51) Int. Cl.
*H01L 29/76*      (2006.01)

(52) U.S. Cl.
USPC ........... 438/239; 257/295; 257/296; 257/309; 257/310; 257/532

(58) Field of Classification Search
USPC ............. 257/788, 295, 310, 309, 296, 532
See application file for complete search history.

(56) References Cited

U.S. PATENT DOCUMENTS

| | | | |
|---|---|---|---|
| 5,046,043 A | 9/1991 | Miller et al. | |
| 5,318,927 A * | 6/1994 | Sandhu et al. | 438/3 |
| 5,864,932 A | 2/1999 | Evans et al. | |
| 5,920,453 A | 7/1999 | Evans et al. | |
| 5,976,928 A | 11/1999 | Kirlin et al. | |
| 5,990,513 A | 11/1999 | Perino et al. | |
| 6,027,947 A | 2/2000 | Evans et al. | |
| 6,150,184 A | 11/2000 | Evans et al. | |
| 6,174,735 B1 | 1/2001 | Evans | |
| 6,190,926 B1 | 2/2001 | Perino et al. | |
| 6,201,726 B1 | 3/2001 | Evans | |
| 6,211,542 B1 * | 4/2001 | Eastep et al. | 257/295 |
| 6,242,299 B1 | 6/2001 | Hickert | |
| 6,249,014 B1 | 6/2001 | Bailey | |
| 6,281,023 B2 | 8/2001 | Eastep et al. | |
| 6,358,755 B1 | 3/2002 | Evans | |
| 6,376,259 B1 | 4/2002 | Chu et al. | |
| 6,423,592 B1 * | 7/2002 | Sun | 438/240 |
| 6,485,988 B2 | 11/2002 | Ma et al. | |
| 6,492,673 B1 | 12/2002 | Fox et al. | |
| 6,495,413 B2 | 12/2002 | Sun et al. | |
| 6,509,601 B1 * | 1/2003 | Lee et al. | 257/310 |
| 6,597,028 B2 | 7/2003 | Fox et al. | |
| 6,613,586 B2 | 9/2003 | Bailey | |
| 2005/0051819 A1 * | 3/2005 | Moon et al. | 257/295 |
| 2009/0152607 A1 * | 6/2009 | Tanaka et al. | 257/295 |

OTHER PUBLICATIONS

International Search Report for International Application No. PCT/US13/38432 dated Aug. 22, 2013; 2 pages.
Written Opinion of the International Searching Authority for International Application No. PCT/US13/38432 mailed Aug. 22, 2013; 5 pages.

* cited by examiner

*Primary Examiner* — Chuong A Luu
*Assistant Examiner* — Rodolfo Fortich

(57) ABSTRACT

A method of encapsulating a ferroelectric capacitor or ferroelectric memory cell includes forming encapsulation materials adjacent to a ferroelectric capacitor. forming a ferroelectric oxide (FEO) layer over the encapsulated ferroelectric capacitor, and forming an FEO encapsulation layer over the ferroelectric oxide to provide additional protection from hydrogen induced degradation.

11 Claims, 2 Drawing Sheets

ENHANCED HYDROGEN BARRIER ENCAPSULATION METHOD FOR THE CONTROL OF HYDROGEN INDUCED DEGRADATION OF FERROELECTRIC CAPACITORS IN AN F-RAM PROCESS

FIELD OF THE INVENTION

The present invention relates to ferroelectric capacitors and ferroelectric memory cells, and more particularly, to a method of further protecting these capacitors and memory cells from degradation during fabrication.

BACKGROUND OF THE INVENTION

The conventional hydrogen barrier encapsulation is to deposit encapsulation materials adjacent to ferroelectric capacitors. Such an encapsulation is shown in U.S. Pat. No. 6,249,014. The encapsulation materials can be formed of a single, dual, or partial layers, or combinations thereof. While these known encapsulation techniques can prevent degradation during the manufacturing process, some degradation still occurs. What is desired is a further barrier encapsulation method such that the ferroelectric capacitor or memory cell can be further protected and manufacturing yields can be improved.

SUMMARY OF THE INVENTION

In the present invention, an additional layer of encapsulation is deposited above the ferroelectric oxide (FEO) to provide additional protection from hydrogen induced degradations. This additional protection is essential to enhance F-RAM yield and reliabilities such as endurance and data retention.

According to the present invention, a method of encapsulating a ferroelectric capacitor includes forming encapsulation materials adjacent to a ferroelectric capacitor, forming a ferroelectric oxide (FEO) over the encapsulated ferroelectric capacitor, and forming additional encapsulation materials over the ferroelectric oxide to provide additional protection from hydrogen induced degradation. The additional encapsulation is referred to as FEO encapsulation. The FEO encapsulation materials can comprise a single material layer, or multiple material layers. The encapsulation method can include performing a recovery anneal, particularly after forming a top electrode contact of the ferroelectric capacitor. The ferroelectric oxide is polished to a desired thickness by chemical mechanical polishing. The FEO encapsulation materials are formed by chemical vapor deposition (CVD), atomic layer deposition (ALD), or physical vapor deposition (PVD). The FEO encapsulation materials comprise an encapsulation layer and a barrier layer. The encapsulation layer can comprise CVD AlOx, ALD AlOx, PVD AlOx, CVD SiNx, PVD SiNx, or DVD SiONx. The barrier layer can comprise CVD AlOx, ALD AlOx, PVD AlOx, CVD SiNx, PVD SiNx, CVD SiONx, PZT, and FEO. The encapsulation layer is between 50 and 1000 Angstroms thick, and the barrier layer is between 50 and 1000 Angstroms thick. The ferroelectric oxide comprises TEOS and other forms of SiO2. The ferroelectric oxide is between 5000 and 120000 Angstroms thick.

According to the present invention, an encapsulated ferroelectric capacitor structure comprises a ferroelectric capacitor encapsulated with adjacent encapsulation materials, a ferroelectric oxide formed over the encapsulated ferroelectric capacitor, and FEO encapsulation materials formed over the ferroelectric oxide to provide additional protection from hydrogen induced degradation. The FEO encapsulation materials can comprise a single material layer, or multiple material layers. The FEO encapsulation materials can comprise an encapsulation layer and a barrier layer. The FEO encapsulation layer comprises CVD AlOx, ALD AlOx, PVD AlOx, CVD SiNx, PVD SiNx, or DVD SiONx. The barrier layer comprises CVD AlOx, ALD AlOx, PVD AlOx, PVD SiNx, CVD SiONx, PZT, and FEO.

The choice of encapsulation materials and the deposition methods are not limited. A single layer or multiple layers with different material can be used. CVD SiNx is a good hydrogen barrier; however the process itself contains a significant amount of hydrogen that can cause great degradation. In the present invention, a recovery anneal is carried out after the Top Electrode Contact (TEC) is formed. The hydrogen degradation caused by CVD SiNx deposition is recovered by the anneal.

DETAILED DESCRIPTION

The ferroelectric capacitors are formed and encapsulated conventionally. Then the ferroelectric oxide is deposited and polished to the desired thickness by chemical Mechanical Polish (CMP). The FEO encapsulation is deposited. The encapsulation materials can be all hydrogen barrier dielectrics. The deposition methods include chemical vapor deposition (CVD), atomic layer deposition (ALD), and physical vapor deposition (PVD). The examples of suitable materials are CVD AlOx, ALD AlOx, PVD AlOx, CVD SiNx, PVD SiNx, DVD SiONx. Subsequently, a contact opening is made through the encapsulation layers and FEO in order to provide top electrode contact (TEC) between metal 1 (M1) and top electrode (TE). TEC recovery anneal is conducted after TEC opening in order to recover the hydrogen degradation during encapsulation deposition, if there is any, and repair the etch damages caused by TEC opening. (AlOx is $Al_2O_3$ when the ratio of Al/O is not specified or defined.)

The TEC recovery anneal can be performed at a temperature range of between 400 and 600° C., between one minute and two hours, in air, or N2+O2, wherein the O2 content is between 1% and 100%.

If there is a reaction between the FEO encapsulation material and M1 system or undesired interface between FEO encapsulation material and M1 system, a layer of dielectric can be deposited on top of the encapsulation layer to separate the encapsulation and M. The examples of suitable materials for the separation layer are CVD A10X, ALD A10x, PVD A10x, CVD SiNx, PVD SiNx, CVD SiONx, PZT, and FEO.

Figure 1:
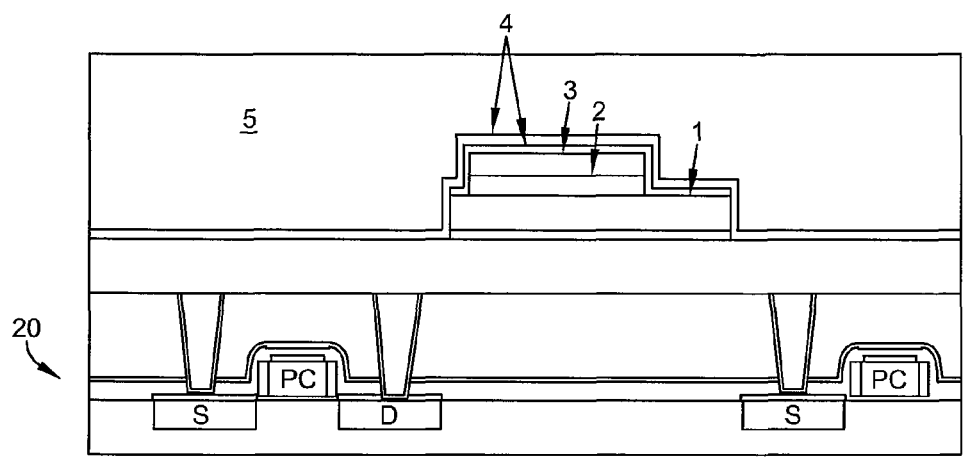
FIGS. 1-4 are sequential cross sectional drawings illustrating forming an additional FEO encapsulation for a ferroelectric capacitor or ferroelectric memory cell according to the present invention.

Referring now to FIG. 1, a planarized transistor 20 in conventionally formed. On top of the planarized surface of the transistor 20 is a ferroelectric capacitor including a bottom electrode (BE) 1, a ferroelectric layer 2, a top electrode (TE) 3. The ferroelectric capacitor is encapsulated using layers 4 as is known in the art. After the ferroelectric capacitor is formed, a ferroelectric oxide (FEO) is formed over the encapsulated ferroelectric capacitor and planarized.

PC referred to in the drawing figures is Poly silicide gate Contact, or simply poly contact.

Figure 2:
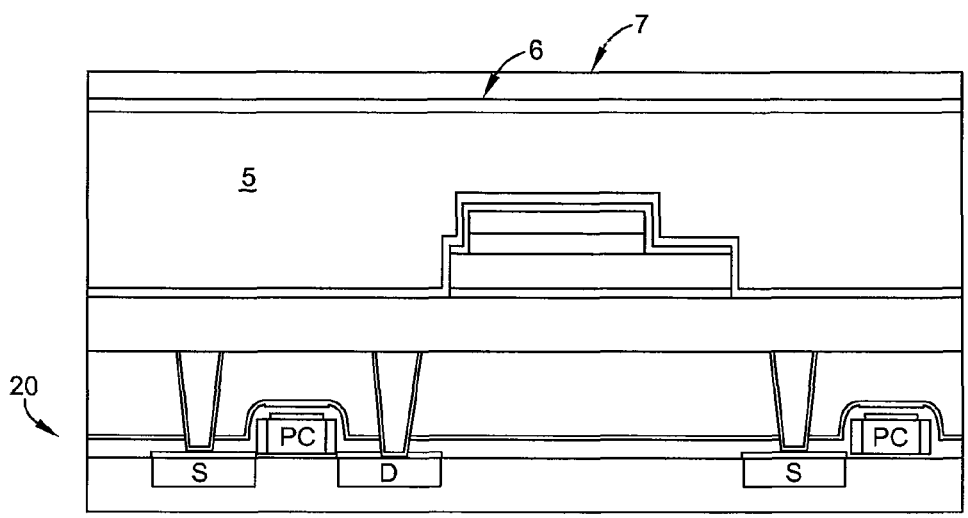

Referring now to FIG. 2, an FEO encapsulation layer 6 is formed, and a separation layer 7 is also formed.

The separation layer is used to prevent the reaction between the FEO encapsulation and Metal 1 (M1) layers. Suitable materials for this layer are described above.

Figure 3:
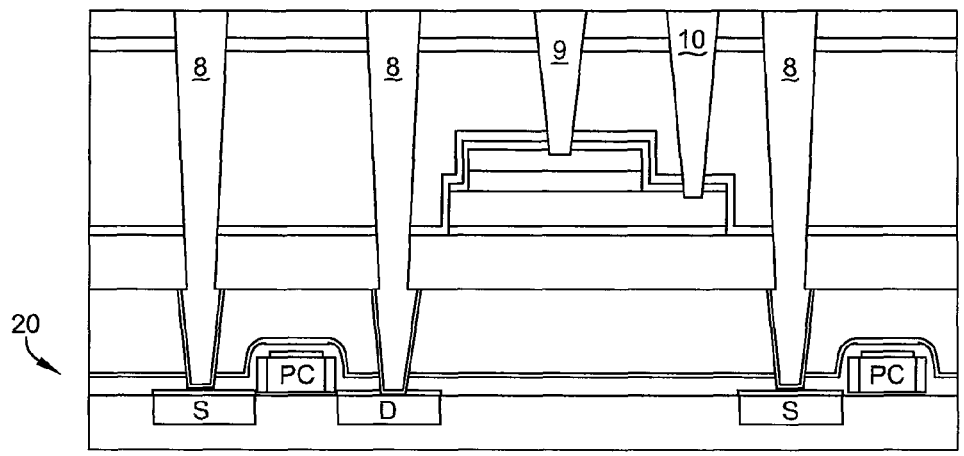

Referring now to FIG. 3, CMOS contacts 8 are formed through the FEO layer 5, the FEO encapsulation layer 6, and the separation layer 7 to the source and drain of the transistor 20, and contacts 10 and 9 are formed to the bottom and top electrodes 1 and 3 of the ferroelectric capacitor. After the contacts are formed, the TEC recovery anneal is performed as described above.

Figure 4:
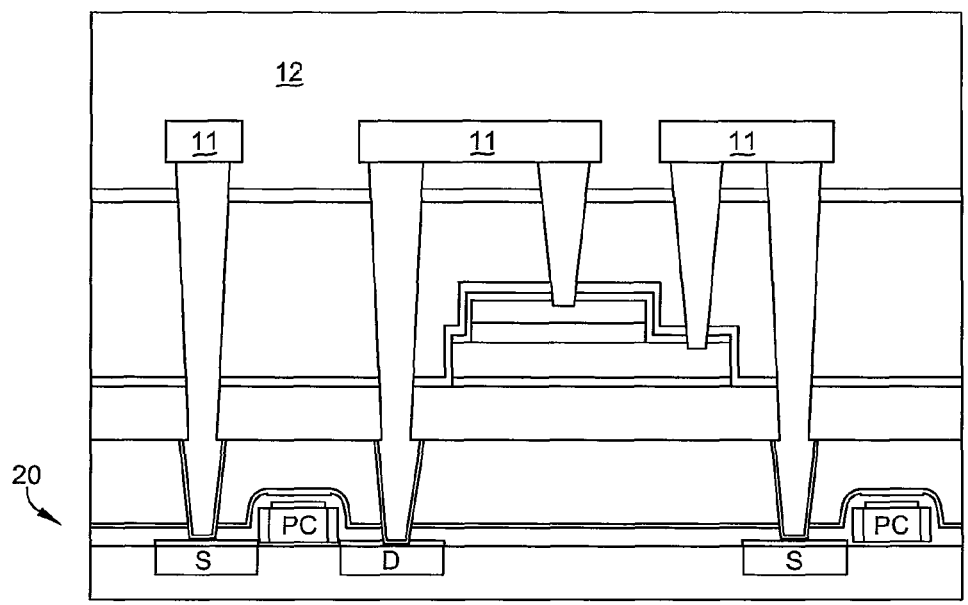

Referring now to FIG. 4, Metal 1 (M1) 11 is formed, which in order of appearance from left to right metalizes the bit line, the intercell connection between the access transistor 20 and the ferroelectric capacitor, and the plate line. An interlayer dielectric layer 12 is then formed on top of the entire structure.

According to the present invention, an additional encapsulation layer and method is presented for additional protection against hydrogen degradation so that manufacturing yields can be improved.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims.

We claim:

1. A method of encapsulating a ferroelectric capacitor, comprising:

forming a ferroelectric oxide (FEO) over an encapsulated ferroelectric capacitor, the ferroelectric oxide comprising a dielectric material;

planarizing the FEO by chemical mechanical polishing to form a planarized FEO;

forming FEO encapsulation materials over the planarized FEO; and forming a metal 1 (M1) layer over the FEO encapsulation materials, wherein forming the FEO encapsulation materials comprise an encapsulation layer and a barrier layer overlying the encapsulation layer to prevent a reaction between the encapsulation layer and the M1 layer, wherein the encapsulation layer and the barrier layer are each between 50 and 1000 Angstroms thick.

2. The method of claim 1 further comprising performing a recovery anneal.

3. The method of claim 2 further comprising performing the recovery anneal after forming a top electrode contact of the ferroelectric capacitor.

4. The method of claim 1 the FEO encapsulation materials comprise multiple material layers.

5. The method of claim 1 wherein the FEO encapsulation materials are formed by chemical vapor deposition (CVD), atomic layer deposition (ALD), or physical vapor deposition (PVD).

6. The method of claim 5 wherein the encapsulation layer comprises CVD AlOx, ALD AlOx, PVD AlOx, CVD SiNx, PVD SiNx, or ALD SiONx.

7. The method of claim 1 wherein the barrier layer is formed by chemical vapor deposition (CVD), atomic layer deposition (ALD), or physical vapor deposition (PVD).

8. The method of claim 7 wherein the barrier layer comprises CVD AlOx, ALD AlOx, PVD AlOx, CVD SiNx, PVD SiNx, CVD SiONx, PZT, or FEO.

9. The method of claim 1 wherein the dielectric material comprises TEOS.

10. The method of claim 1 wherein planarizing the FEO comprises polishing the ferroelectric oxide to a desired thickness.

11. The method of claim 10 wherein the ferroelectric oxide is between 5000 and 120,000 Angstroms thick.

* * * * *